(12) United States Patent
Ozaki et al.

(10) Patent No.: US 10,009,998 B1
(45) Date of Patent: Jun. 26, 2018

(54) METHOD OF MANUFACTURING SUBSTRATE AND SUBSTRATE

(71) Applicant: FUJITSU LIMITED, Kawasaki-shi, Kanagawa (JP)

(72) Inventors: Norikazu Ozaki, Nagano (JP); Hiroshi Miyao, Kawasaki (JP); Satoru Hasegawa, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/806,385

(22) Filed: Nov. 8, 2017

(30) Foreign Application Priority Data

Dec. 2, 2016 (JP) ................. 2016-235436

(51) Int. Cl.
*H05K 1/11* (2006.01)
*H05K 3/40* (2006.01)
*H05K 3/00* (2006.01)
*H05K 3/42* (2006.01)

(52) U.S. Cl.
CPC ........... *H05K 1/115* (2013.01); *H05K 3/0047* (2013.01); *H05K 3/4046* (2013.01); *H05K 3/4084* (2013.01); *H05K 3/42* (2013.01); *H05K 2201/10303* (2013.01); *H05K 2201/10409* (2013.01)

(58) Field of Classification Search
CPC .. H05K 3/4038; H05K 3/4046; H05K 3/4053; H05K 3/4061; H05K 3/4069; H05K 3/4076; H05K 3/4084; H05K 1/115; H05K 1/116
See application file for complete search history.

(56) References Cited

U.S. PATENT DOCUMENTS 5,257,452 A    11/1993   Imai et al.

FOREIGN PATENT DOCUMENTS

| JP | 4-96392 A    | 3/1992  |
| JP | H5-304223    | 11/1993 |
| JP | 2005-116463 A| 4/2005  |
| JP | 2006-156435  | 6/2006  |
| JP | 2006-319044 A| 11/2006 |
| JP | 2007-180079  | 7/2007  |
| JP | 2009-016662  | 1/2009  |

OTHER PUBLICATIONS

Extended European Search Report dated Apr. 25, 2018 for corresponding European Patent Application No. 17201822.8, 8 pages.

*Primary Examiner* — Jeremy C Norris
(74) *Attorney, Agent, or Firm* — Fujitsu Patent Center

(57) ABSTRACT

A first through hole is formed in a base, a conductive layer covering an inner wall side surface of the first through hole is formed, a columnar electric conductor having a Vickers hardness of a value in a range of 30 Hv or more and 400 Hv or less is inserted into the first through hole formed with the conductive layer, pressure is applied in a vertical direction to the columnar electric conductor, and a second through hole is formed in the columnar electric conductor.

20 Claims, 10 Drawing Sheets

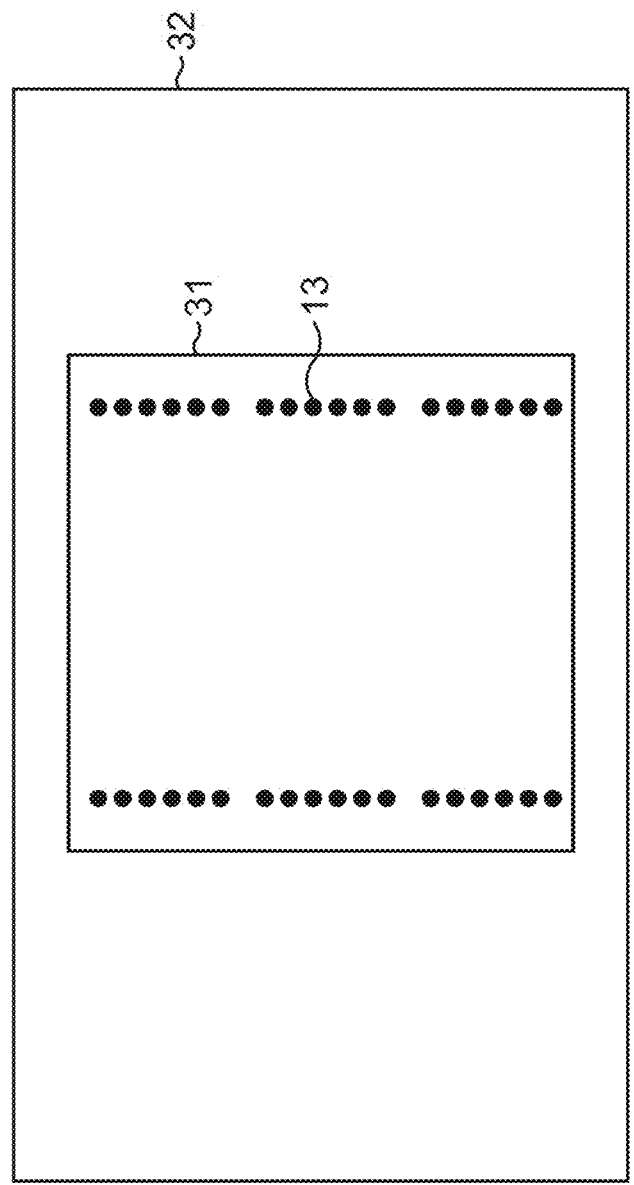

METHOD OF MANUFACTURING SUBSTRATE AND SUBSTRATE

CROSS-REFERENCE TO RELATED APPLICATION

This application is based upon and claims the benefit of priority of the prior Japanese Patent Application No. 2016-235436, filed on Dec. 2, 2016, the entire contents of which are incorporated herein by reference.

FIELD

The embodiments discussed herein are directed to a method of manufacturing a substrate and a substrate.

BACKGROUND

Conventionally, a so-called thick copper substrate has attracted attention as a printed-circuit board corresponding to large current. In the thick copper substrate, a base is formed by stacking a plurality of copper layers having a thickness of, for example, 70 μm or more via insulating resin layers (for example, glass epoxy resin layers). The base is formed with a plurality of through holes, and a copper plating layer connected to the copper layers is formed on an inner wall surface of the through hole. Into the through hole, a terminal is inserted and bonded by solder filled in the through hole.

Patent Document 1: Japanese Laid-open Patent Publication No. 2009-16662
Patent Document 2: Japanese Laid-open Patent Publication No. 2007-180079
Patent Document 3: Japanese Laid-open Patent Publication No. 2006-156435
Patent Document 4: Japanese Laid-open Patent Publication No. 5-304223

In recent years, a method of fixing the terminal in the through hole of the printed-circuit board without adhering it using solder, for example, a method using a press-fit pin as the terminal is devised. In this case, the press-fit pin is inserted into and fixed to the through hole without requiring solder bonding. The press-fit pin is brought into contact with and fix to, by its mechanical resilient restoring force, a copper plating layer in the through hole into which the press-fit pin is inserted.

In the case of fixing the terminal such as a press-fit pin into the through hole of the printed-circuit board without using solder, a part of a side surface of the copper plating layer is damaged (slightly chipped away, deformed or the like) inside the through hole in inserting the press-fit pin or the like. When the copper plating layer is thin, influence due to the damage to the copper plating layer in inserting the press-fit pin or the like is big, bringing about a problem of failing to secure connection reliability of the press-fit pin or the like.

Another problem is that, in the case of using the terminal such as the press-fit pin or the like in the thick copper substrate, if the copper plating layer on the inner wall surface of the through hole is thin, cracks occur due to thermal stress in the copper plating layer, caused by a difference in coefficient of thermal expansion between the copper layer and the resin layer.

To address the above problems, a measure of forming the copper plating layer thick is conceivable. However, this measure has the following problem.

The plating method is low in accuracy of controlling the thickness of the copper plating layer and therefore has a difficulty in obtaining a hole diameter with a desired accuracy corresponding to the terminal such as the press-fit pin or the like. Further, the copper plating layer is formed from the inner wall side surface of the through hole of the thick copper substrate to parts of the front and rear surfaces of the base, so that when the copper plating layer is formed thick, the front and rear surface parts become also thick. Therefore, the patterning property of the copper plating layer decreases, resulting in difficulty in microfabrication. Besides, since the thickness of the copper plating layer is proportional to the plating treatment time, forming the copper plating layer thick leads to a significant decrease in productivity.

SUMMARY

In one aspect, a method of manufacturing a substrate includes: forming a first hole, the first hole penetrating a base; forming a conductive layer, the conductive layer covering an inner wall side surface of the first hole; inserting a columnar electric conductor into the first hole formed with the conductive layer; applying pressure in a vertical direction to the columnar electric conductor; and forming a second hole in the columnar electric conductor.

In one aspect, a substrate includes: a base including a first hole being a through hole; a first conductive layer covering an inner wall side surface of the first hole; and a second conductive layer covering a side surface of the first conductive layer and including a second hole, wherein the second conductive layer is different in crystalline structure from the first conductive layer and has a Vickers hardness of a value of 30 Hv or more.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 9A and 9B are schematic views illustrating a schematic configuration of an inverter according to a third embodiment.

DESCRIPTION OF EMBODIMENTS

Hereinafter, preferred embodiments will be explained in detail with reference to accompanying drawings.

First Embodiment

In this embodiment, a thick copper substrate is disclosed as a printed-circuit board and its configuration will be explained together with a manufacturing method thereof.

FIGS. 1A to 1D and FIGS. 2A to 2C are schematic sectional views illustrating the method of manufacturing the thick copper substrate according to this embodiment in order of steps.

Figure 1A:
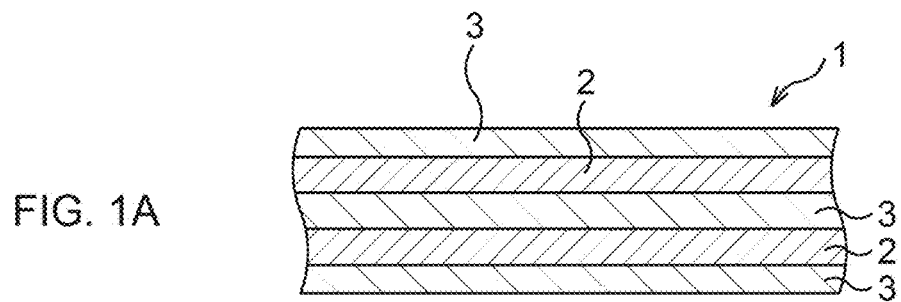
FIGS. 1A to 1D are schematic sectional views illustrating a method of manufacturing a thick copper substrate according to a first embodiment in order of steps.

First of all, as illustrated in FIG. 1A, a base 1 of the thick copper substrate is prepared.

The base 1 is formed of, for example, a plurality of copper layers 2 having a predetermined thickness of 70 μm or more stacked via insulating resin layers (for example, glass epoxy resin layers) 3.

Figure 1B:
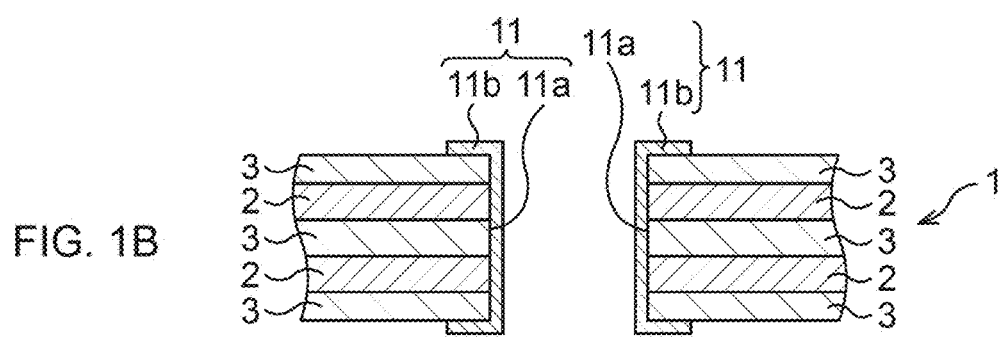

Subsequently, as illustrated in FIG. 1B, a PTH (Plated Through Hole) 11 is formed in the base 1.

In detail, first, a first through hole 11a is formed as a first hole in the base 1.

Next, for example, a Cu layer is formed on the front surface and the rear surface of the base 1 including an inner wall side surface of the first through hole 11a by the plating method. The Cu layer is formed into a thickness of a value in a range of about 40 μm or more and 70 μm or less, for example, about 70 μm. Then, patterning is performed on the front surface and the rear surface of the base 1 to remove a part of the Cu layer to thereby form a first conductive layer 11b extending from the inner wall side surface of the first through hole 11a up to parts on the front surface and on the rear surface of the base 1. Note that it is also conceivable to form, as the first conductive layer 11b, a stacked structure of Cu/Ni/Au (Cu is at the lowermost layer) in place of forming the CU layer.

Thus, the PTH 11 including the first conductive layer 11b covering the inner wall side surface of the first through hole 11a is formed.

Figure 1C:
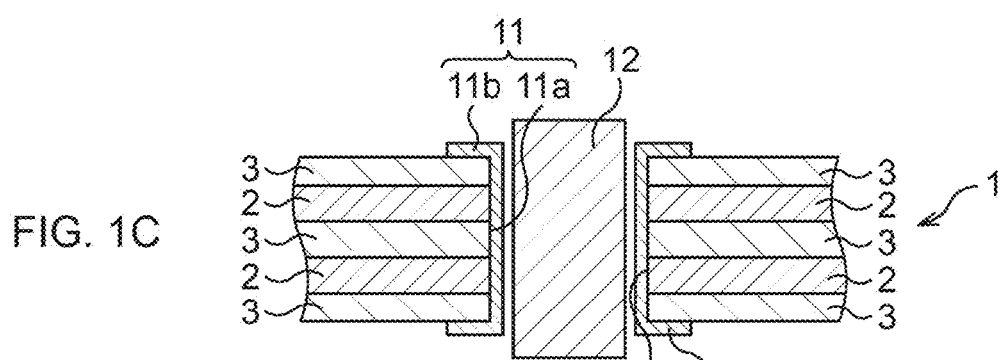

Subsequently, as illustrated in FIG. 1C, a Cu coin 12 is inserted into the PTH 11.

In this embodiment, the Cu coin 12 being a columnar Cu material is used as a columnar electric conductor to be inserted into the PTH 11. The Cu coin 12 is formed to have a length slightly larger than the thickness of the base 1, a cross-sectional shape in the same shape (circular shape here) as that of the first through hole 11a, and a diameter slightly smaller than the diameter of the PTH 11 (diameter of the first through hole 11a via the first conductive layer 11b). The Cu coin 12 has a Vickers hardness of a value in a range of 30 Hv or more and 400 Hv or less, here, about 100 Hv.

Figure 1D:
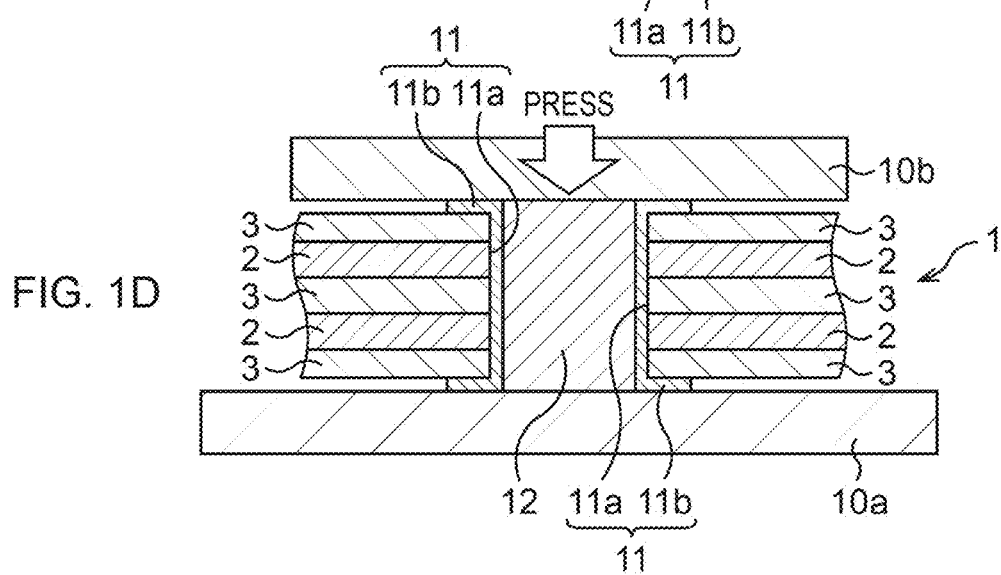

Subsequently, as illustrated in FIG. 1D, pressure is applied in a vertical direction to the Cu coin 12.

In detail, the base 1 with the Cu coin 12 inserted into the PTH 11 is mounted and fixed onto a support table 10a. A pressing plate 10b is placed on the upper surface of the base 1, and applies pressure downward. Thus, the Cu coin 12 is reduced in length and expanded in diameter and thereby pressure-bonded to the first conductive layer 11b.

Figure 3A:
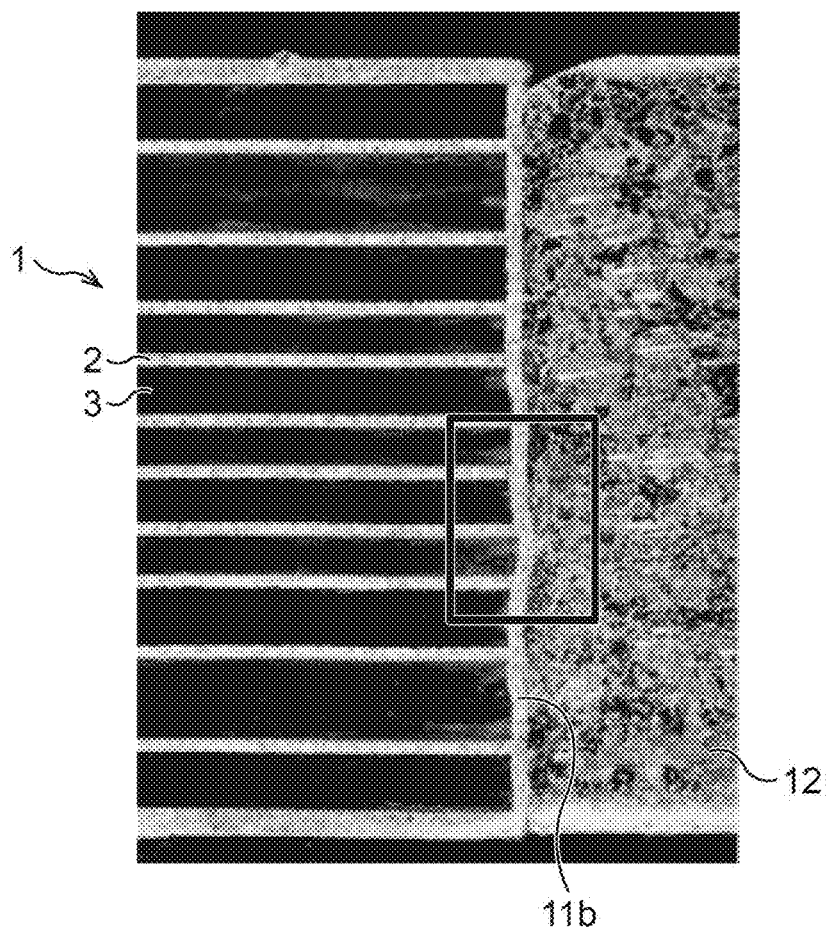
FIGS. 3A and 3B are photographs indicating a pressure bonding state between a Cu layer formed by the plating method and a Cu coin.
Figure 3B:
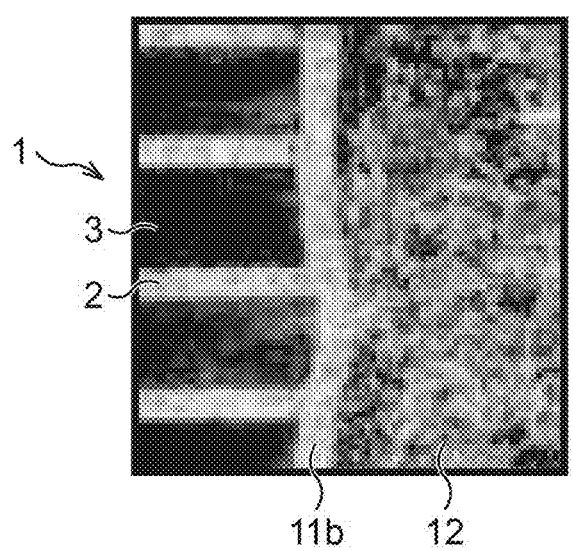

FIGS. 3A and 3B are photographs indicating a pressure bonding state between the Cu layer formed by the plating method and the Cu coin, and FIG. 3B indicates an enlarged appearance in a rectangular frame in FIG. 3A.

Both of the first conductive layer 11b and the Cu coin 12 are made of the same Cu as a material in this embodiment, but the Cu material of the Cu coin 12 changes in quality due to the application of the pressure. As a result, the Cu coin 12 becomes different in crystalline state from the first conductive layer 11b formed by the plating method, and its crystal grains become larger than those of the first conductive layer 11b. Since the Cu coin 12 is pressure-bonded to the first conductive layer 11b, the first conductive layer 11b and the Cu coin 12 are brought into a close contact state without any gap therebetween on the inner wall side surface of the PTH 11. Further, since a pressure-bonding form of applying pressure to the Cu coin 12 inserted into the PTH 11 is taken, a dent is generated in the Cu coin 12 at an edge portion at the uppermost portion of the PTH 11. This dent can be confirmed also by observing the base 1 from above.

Figure 2A:
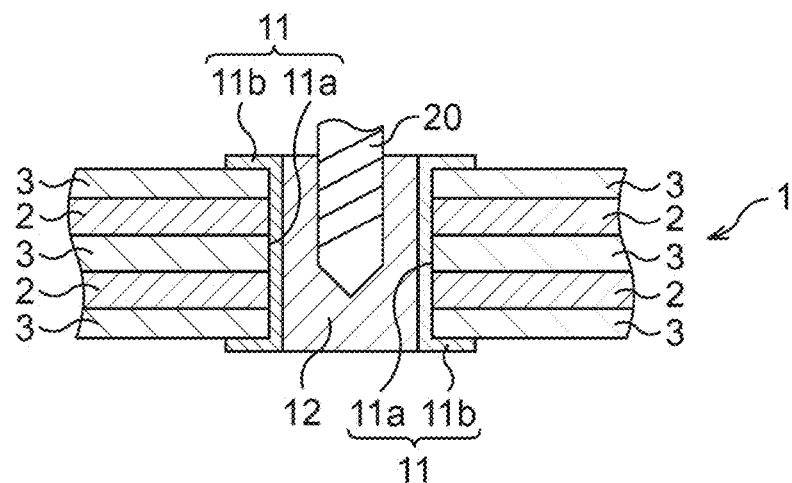
FIGS. 2A to 2C are schematic sectional views illustrating the method of manufacturing the thick copper substrate according to the first embodiment in order of steps, subsequent to FIGS. 1A to 1D.
Figure 2B:
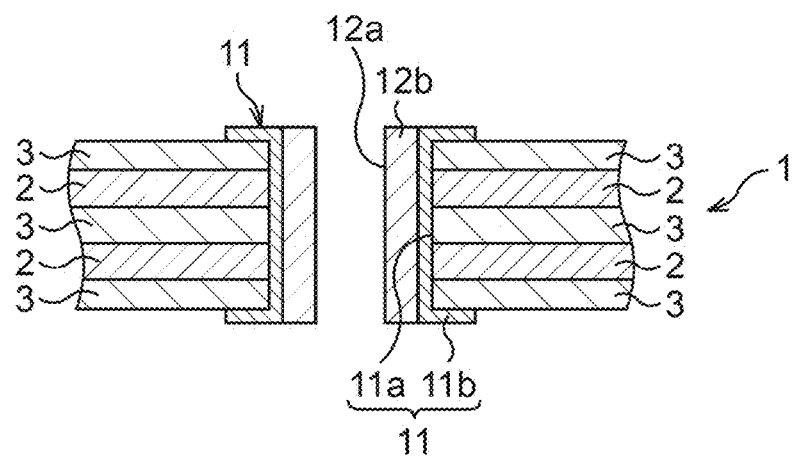

Subsequently, as illustrated in FIGS. 2A, 2B, a second through hole 12a is formed as a second hole in the Cu coin 12. Thus, the thick copper substrate according to this embodiment is formed.

In detail, as illustrated in FIG. 2A, the second through hole 12a is formed using a drill 20 at a central portion of the Cu coin 12. The drilling work is high in working accuracy and provides a pore diameter tolerance of about ±30 μm or less. The second through hole 12a is formed into, for example, a desired diameter of about 1.0 mm±30 μm. By forming the second through hole 12a, a second conductive layer 12b composed of Cu covering the side surface (inner wall side surface of the PTH 11) of the first conductive layer 11b is formed as illustrated in FIG. 2B. The second conductive layer 12b is formed into a thickness of, for example, about 400 μm and is brought into close contact with and fixed to the side surface of the first conductive layer 11b.

Figure 2C:
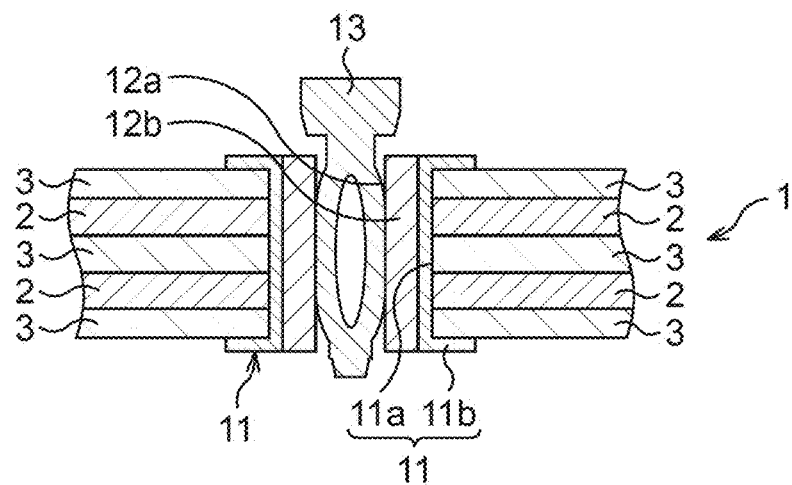

In this thick copper substrate, as illustrated in FIG. 2C, a press-fit pin 13 as a terminal is inserted into and fixed to the second through hole 12a.

The press-fit pin 13 is made to be attachable to and detachable from the second through hole 12a, and is brought into contact with and fix to, by its mechanical resilient restoring force, the side surface of the second conductive layer 12b inside the second through hole 12a in which the press-fit pin 13 is inserted.

In this embodiment, the second conductive layer 12b in close contact with the side surface of the first conductive layer 11b in the PTH 11 is formed without the first conductive layer 11b being formed thick, thereby securing the conductive layer thickness on the inner wall side surface of the PTH 11. With this configuration, the second conductive layer 12b protects the first conductive layer 11b to suppress occurrence of cracks in the first conductive layer 11b. Since the first conductive layer 11b made by the plating method is formed thin, the first conductive layer 11b can be easily formed into a fine pattern without deteriorating the productivity of plating. Even if a part of the second conductive layer 12b is slightly damaged in inserting the press-fit pin 13, its influence is small because a sufficient conductive layer thickness by the first conductive layer 11b and the second conductive layer 12b is secured on the inner wall side surface of the PTH 11, so that the high connection reliability of the press-fit pin 13 is maintained.

The second conductive layer 12b being a conductive layer with which the press-fit pin 13 comes into contact has a Vickers hardness set to a value in a range of 30 Hv or more and 400 Hv or less. The conductive layer is required to have hardness to withstand a load in inserting the press-fit pin 13 (at a level of maintaining desired connection reliability even when receiving pressure contact from the press-fit pin 13). The lower limit value of the hardness is evaluated to be about 30 Hv in Vickers hardness. On the other hand, if the conductive layer is too hard, appropriate press fitting of the Cu coin 12 into the PTH 11 becomes difficult at the step in FIG. 1D. The upper limit value of the hardness is evaluated to be about 400 Hv in Vickers hardness. In this embodiment, Cu being a conductive material having a Vickers hardness of a value in a range of 30 Hv or more and 400 Hv or less is used as the material of the second conductive layer 12b. The second conductive layer 12b is surely brought into close contact with and fixed to the first conductive layer 11b to suppress occurrence of cracks in the first conductive layer 11b and realize a thick copper substrate securing the connection reliability even if the press-fit pin 13 is inserted thereinto and fixed thereto.

The second conductive layer 12b covering the side surface of the first conductive layer 11b is formed to increase the conductive layer thickness on the inner wall side surface of the PTH 11, thereby increasing also the amount of current allowed to flow through one PTH 11. This makes it possible to reduce the number of PTHs 11 required for desired current to flow, thereby improving the degree of freedom in substrate design.

As described above, according to this embodiment, the second conductive layer 12b with a desired thickness is accurately secured on the inner wall side surface of the PTH 11 without using solder. This realizes a thick copper substrate in which the press-fit pin 13 can be inserted into and fixed to the second through hole 12a with high connection reliability without damaging the first conductive layer 11b.

MODIFIED EXAMPLES

Hereinafter, modified examples of the first embodiment will be explained.

Modified Example 1

In a modified example 1, a thick copper substrate is disclosed as in the first embodiment, but is different from the first embodiment in that the second hole formed in the Cu coin is different.

Figure 4A:
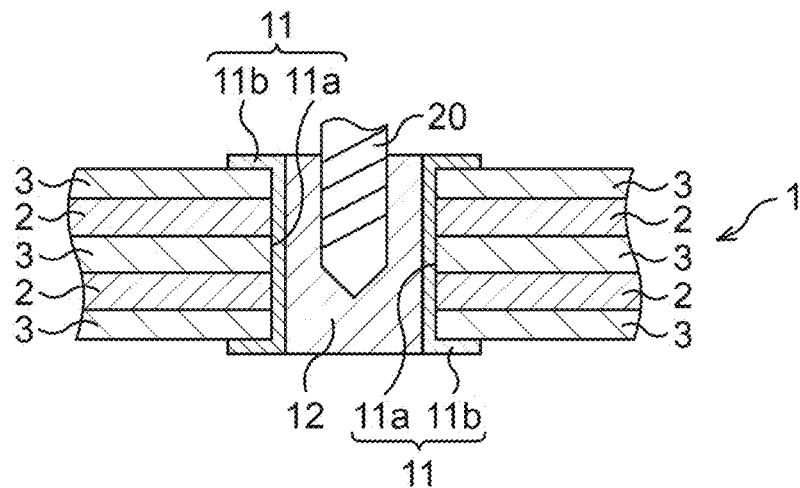
FIGS. 4A to 4C are schematic sectional views illustrating main steps of a method of manufacturing a thick copper substrate according to a modified example 1 of the first embodiment.
Figure 4B:
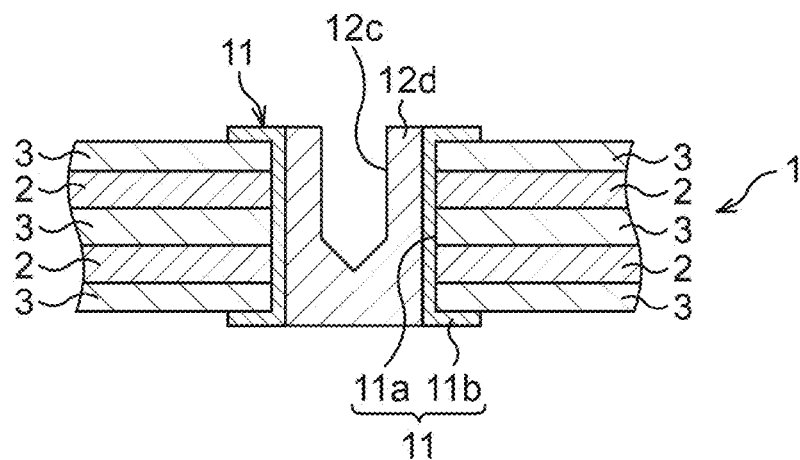
Figure 4C:
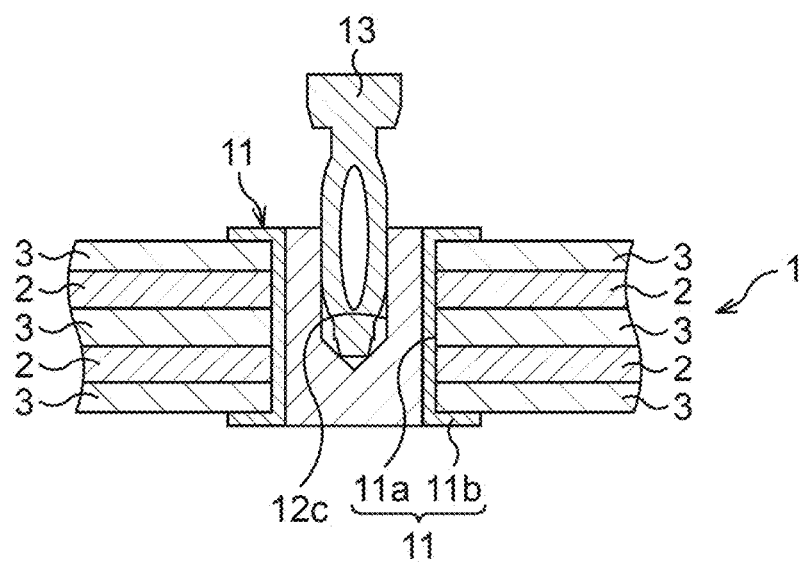

FIGS. 4A to 4C are schematic sectional views illustrating main steps of a method of manufacturing the thick copper substrate according to the modified example 1 of the first embodiment. Note that the same components as those of the thick copper substrate according to the first embodiment are denoted by the same numerals, and detailed explanation thereof will be omitted.

First of all, the steps in FIGS. 1A to 1D are performed as in the first embodiment. The Cu coin 12 is pressure-bonded to the first conductive layer 11b.

Subsequently, as illustrated in FIGS. 4A, 4B, a non-through hole 12c not penetrating the Cu coin 12 is formed as a second hole in the Cu coin 12. Thus, the thick copper substrate according to this embodiment is formed.

In detail, as illustrated in FIG. 4A, the non-through hole 12c is formed by working a central portion of the Cu coin 12 using the drill 20 down to a middle in the length direction of the Cu coin 12, for example, about half in the length direction. The drilling work is high in working accuracy and provides a pore diameter tolerance of about ±30 µm or less. The non-through hole 12c is formed into, for example, a desired diameter of about 1.0 mm±30 µm. By forming the non-through hole 12c, a second conductive layer 12d composed of Cu having a bottom portion and covering the side surface (inner wall side surface of the PTH 11) of the first conductive layer 11b is formed as illustrated in FIG. 4B. The second conductive layer 12d has a side surface portion formed into a thickness of, for example, about 400 µm and is brought into close contact with and fixed to the side surface of the first conductive layer 11b.

In this thick copper substrate, as illustrated in FIG. 4C, the press-fit pin 13 as the terminal is inserted into and fixed to the non-through hole 12c.

The press-fit pin 13 is made to be attachable to and detachable from the non-through hole 12c, and is brought into contact with and fix to, by its mechanical resilient restoring force, the side surface of the second conductive layer 12d inside the non-through hole 12c in which the press-fit pin 13 is inserted.

In the modified example 1, the second conductive layer 12d in close contact with the side surface of the first conductive layer 11b in the PTH 11 is formed without the first conductive layer 11b being formed thick, thereby securing the conductive layer thickness on the inner wall side surface of the PTH 11. With this configuration, the second conductive layer 12d protects the first conductive layer 11b to suppress occurrence of cracks in the first conductive layer 11b. Since the first conductive layer 11b made by the plating method is formed thin, the first conductive layer 11b can be easily formed into a fine pattern without deteriorating the productivity of plating. Even if a part of the second conductive layer 12d is slightly damaged in inserting the press-fit pin 13, its influence is small because a sufficient conductive layer thickness by the first conductive layer 11b and the second conductive layer 12d is secured on the inner wall side surface of the PTH 11, so that the high connection reliability of the press-fit pin 13 is maintained.

In the modified example 1, the conductive layer with which the press-fit pin 13 comes into contact, here, the second conductive layer 12d has a Vickers hardness set to a value in a range of 30 Hv or more and 400 Hv or less. The conductive layer is required to have hardness to withstand a load in inserting the press-fit pin 13 (at a level of maintaining desired connection reliability even when receiving pressure contact from the press-fit pin 13). The lower limit value of the hardness is evaluated to be about 30 Hv in Vickers hardness. On the other hand, if the conductive layer is too hard, appropriate press fitting of the Cu coin 12 into the PTH 11 becomes difficult at the step in FIG. 4B. The upper limit value of the hardness is evaluated to be about 400 Hv in Vickers hardness. In the modified example 1, Cu being a conductive material having a Vickers hardness of a value in a range of 30 Hv or more and 400 Hv or less is used as the material of the second conductive layer 12d. The second conductive layer 12d is surely brought into close contact with and fixed to the first conductive layer 11b to suppress occurrence of cracks in the first conductive layer 11b and realize a thick copper substrate securing the connection reliability even if the press-fit pin 13 is inserted thereinto and fixed thereto.

The second conductive layer 12d covering the side surface of the first conductive layer 11b is formed to increase the conductive layer thickness on the inner wall side surface of the PTH 11, thereby increasing also the amount of current allowed to flow through one PTH 11. This makes it possible to reduce the number of PTHs 11 required for desired current to flow, thereby improving the degree of freedom in substrate design.

As described above, according to the modified example 1, the conductive layer (the second conductive layer 12d) with a desired thickness is accurately secured on the inner wall side surface of the PTH 11 without using solder. This realizes a thick copper substrate in which the press-fit pin 13 can be inserted into and fixed to the non-through hole 12c with high connection reliability without damaging the first conductive layer 11b.

Modified Example 2

In a modified example 2, a thick copper substrate is disclosed as in the first embodiment, but is different from the first embodiment in that the conductive layer formed in the PTH is different.

FIGS. 5A to 5C and FIGS. 6A and 6B are schematic sectional views illustrating main steps of a method of manufacturing the thick copper substrate according to the modified example 2 of the first embodiment. Note that the same components as those of the thick copper substrate according to the first embodiment are denoted by the same numerals, and detailed explanation thereof will be omitted.

First of all, the steps in FIGS. 1A and 1B are performed as in the first embodiment. The base 1 is formed with the PTH 11.

Figure 5A:
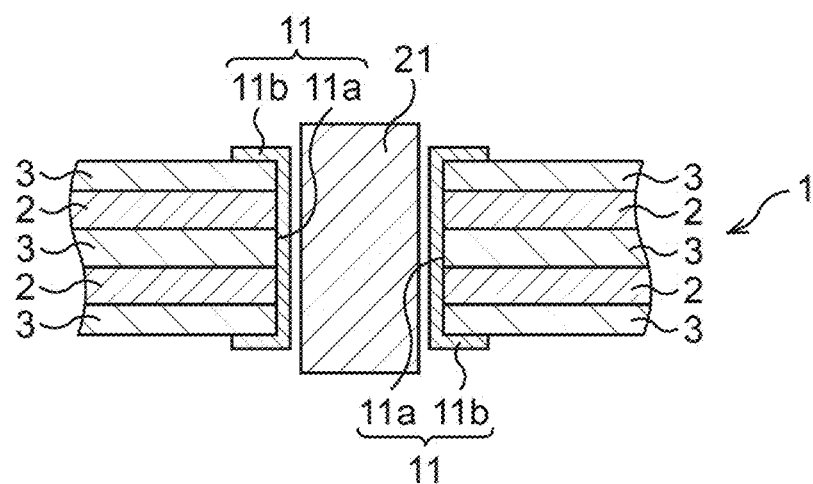
FIGS. 5A to 5C are schematic sectional views illustrating main steps of a method of manufacturing a thick copper substrate according to a modified example 2 of the first embodiment.

Subsequently, as illustrated in FIG. 5A, an Al alloy coin 21 is inserted into the PTH 11.

In this modified example, a conductive material differing from Cu of the first conductive layer 11b, here, an Al alloy is employed and the Al alloy coin 21 being a columnar Al alloy material is used as the columnar electric conductor to be inserted into the PTH 11. The Al alloy coin 21 is formed to have a length slightly larger than the thickness of the base 1, a cross-sectional shape in the same shape (circular shape here) as that of the first through hole 11a, and a diameter slightly smaller than the diameter of the PTH 11 (diameter of the first through hole 11a via the first conductive layer 11b). The Al alloy coin 21 has a Vickers hardness of a value in a range of 30 Hv or more and 400 Hv or less, here, about 150 Hv.

Note that one kind selected from Al, Fe, a Cu alloy, a Ni alloy, a Fe alloy and the like other than the Al alloy may be employed as the conductive material of the columnar electric conductor, and a coin made of the conductive material may be used in this modified example.

Figure 5B:
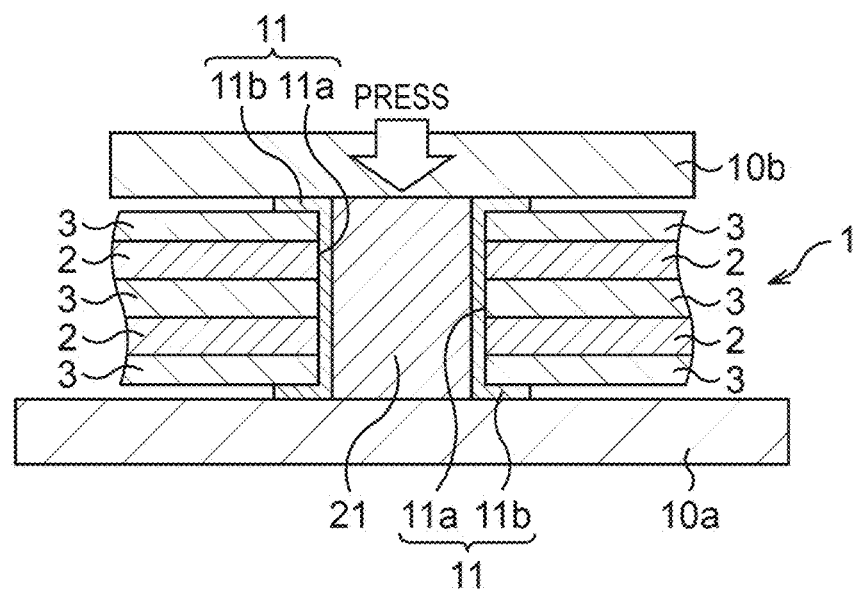

Subsequently, as illustrated in FIG. 5B, pressure is applied in a vertical direction to the Al alloy coin 21.

In detail, the base 1 with the Al alloy coin 21 inserted into the PTH 11 is mounted and fixed onto the support table 10a. The pressing plate 10b is placed on the upper surface of the base 1, and applies pressure downward. Thus, the Al alloy coin 21 is reduced in length and expanded in diameter and thereby pressure-bonded to the first conductive layer 11b.

Since the first conductive layer 11b and the Al alloy coin 21 are made of different conductive materials in the modified example 2, the pressure-bonded Al alloy coin 21 is different in crystalline state from the first conductive layer 11b formed by the plating method. Since the Al alloy coin 21 is pressure-bonded to the first conductive layer 11b, the first conductive layer 11b and the Al alloy coin 21 are brought into a close contact state without any gap therebetween on the inner wall side surface of the PTH 11. Further, since a pressure-bonding form of applying pressure to the Al alloy coin 21 inserted into the PTH 11 is taken, a dent is generated in the Al alloy coin 21 at an edge portion at the uppermost portion of the PTH 11. This dent can be confirmed also by observing the base 1 from above.

Figure 5C:
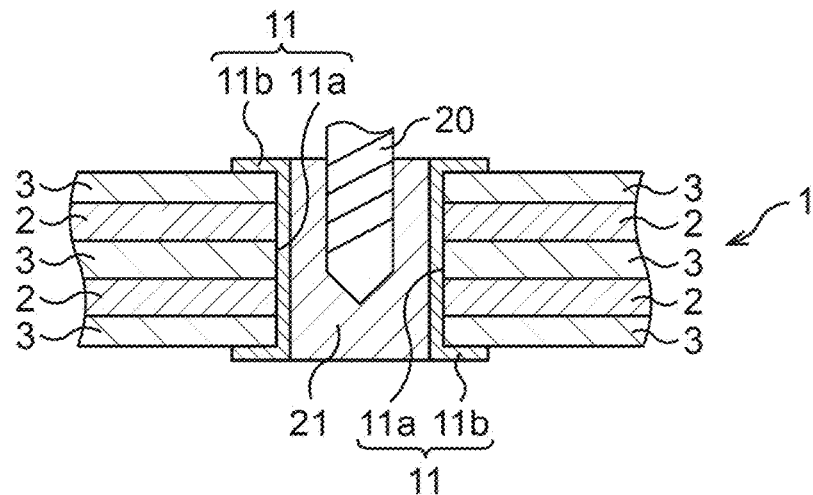
Figure 6A:
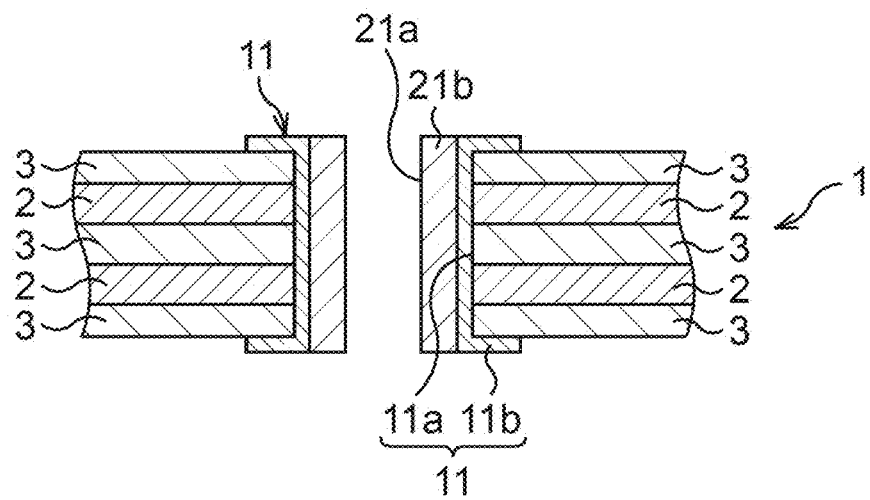
FIGS. 6A and 6B are schematic sectional views illustrating the main steps of the method of manufacturing the thick copper substrate according to the modified example of the first embodiment, subsequent to FIGS. 5A to 5C.

Subsequently, as illustrated in FIG. 5C, FIG. 6A, a second through hole 21a is formed in the Al alloy coin 21. Thus, the thick copper substrate according to this modified example is formed.

In detail, as illustrated in FIG. 5C, the second through hole 21a is formed using the drill 20 at a central portion of the Al alloy coin 21. The drilling work is high in working accuracy and provides a pore diameter tolerance of about ±30 μm or less. The second through hole 21a is formed into, for example, a desired diameter of about 1.0 mm±30 μm. By forming the second through hole 21a, a second conductive layer 21b composed of an Al alloy covering the side surface (inner wall side surface of the PTH 11) of the first conductive layer 11b is formed as illustrated in FIG. 6A. The second conductive layer 21b is formed into a thickness of, for example, about 400 μm and is brought into close contact with and fixed to the side surface of the first conductive layer 11b.

Figure 6B:
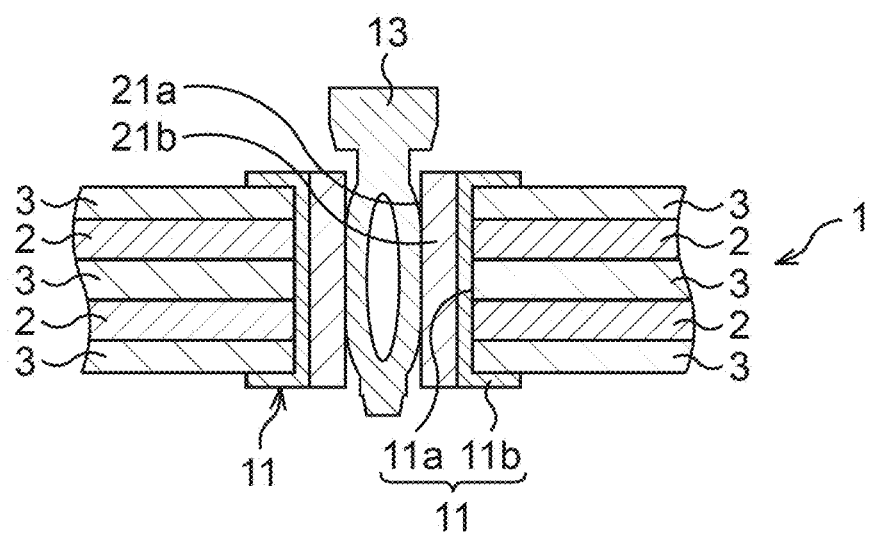

In this thick copper substrate, as illustrated in FIG. 6B, the press-fit pin 13 as the terminal is inserted into and fixed to the second through hole 21a.

The press-fit pin 13 is made to be attachable to and detachable from the second through hole 21a, and is brought into contact with and fix to, by its mechanical resilient restoring force, the side surface of the second conductive layer 21b inside the second through hole 21a in which the press-fit pin 13 is inserted.

In the modified example 2, the second conductive layer 21b in close contact with the side surface of the first conductive layer 11b in the PTH 11 is formed without the first conductive layer 11b being formed thick, thereby securing the conductive layer thickness on the inner wall side surface of the PTH 11. With this configuration, the second conductive layer 21b protects the first conductive layer 11b to suppress occurrence of cracks in the first conductive layer 11b. Since the first conductive layer 11b made by the plating method is formed thin, the first conductive layer 11b can be easily formed into a fine pattern without deteriorating the productivity of plating. Even if a part of the second conductive layer 21b is slightly damaged in inserting the press-fit pin 13, its influence is small because a sufficient conductive layer thickness by the first conductive layer 11b and the second conductive layer 21b is secured on the inner wall side surface of the PTH 11, so that the high connection reliability of the press-fit pin 13 is maintained.

In the modified example 2, the conductive layer with which the press-fit pin 13 comes into contact, here, the second conductive layer 21b has a Vickers hardness set to a value in a range of 30 Hv or more and 400 Hv or less. The conductive layer is required to have hardness to withstand a load in inserting the press-fit pin 13 (at a level of maintaining desired connection reliability even when receiving pressure contact from the press-fit pin 13). The lower limit value of the hardness is evaluated to be about 30 Hv in Vickers hardness. On the other hand, if the conductive layer is too hard, appropriate press fitting of the Al alloy coin 21 into the PTH 11 becomes difficult at the step in FIG. 5B. The upper limit value of this hardness is evaluated to be about 400 Hv in Vickers hardness. In the modified example 2, an Al alloy being a conductive material having a Vickers hardness of a value in a range of 30 Hv or more and 400 Hv or less is used as the material of the second conductive layer 21b. The second conductive layer 21b is surely brought into close contact with and fixed to the first conductive layer 11b to suppress occurrence of cracks in the first conductive layer 11b and realize a thick copper substrate securing the connection reliability even if the press-fit pin 13 is inserted thereinto and fixed thereto.

The second conductive layer 21b covering the side surface of the first conductive layer 11b is formed to increase the conductive layer thickness on the inner wall side surface of the PTH 11, thereby increasing also the amount of current allowed to flow through one PTH 11. This makes it possible to reduce the number of PTHs 11 required for desired current to flow, thereby improving the degree of freedom in substrate design.

As described above, according to the modified example, the conductive layer (the second conductive layer 21b) with a desired thickness is accurately secured on the inner wall side surface of the PTH 11 without using solder. This realizes a thick copper substrate in which the press-fit pin 13 can be inserted into and fixed to the second through hole 21a with high connection reliability without damaging the first conductive layer 11b.

Second Embodiment

In this embodiment, a thick copper substrate is disclosed as in the first embodiment, but is different from the first embodiment in that a terminal inserted into and fixed to a PTH is different.

Figure 7A:
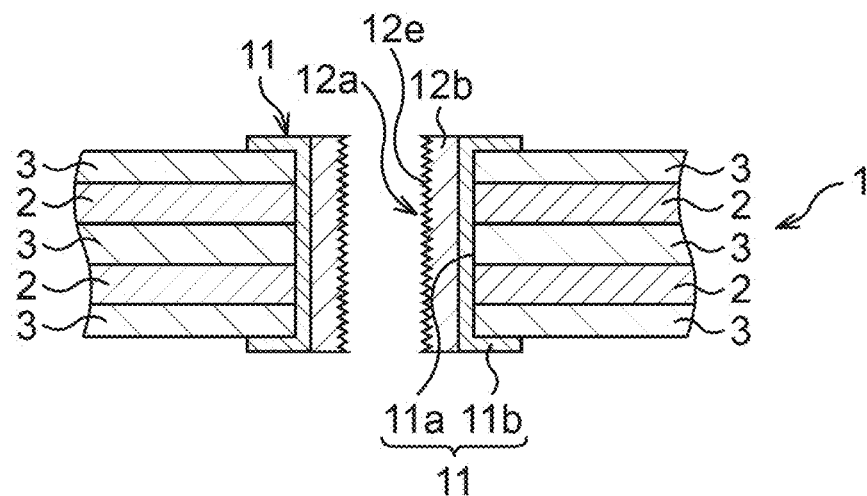
FIGS. 7A and 7B are schematic sectional views illustrating main steps of a method of manufacturing a thick copper substrate according to a second embodiment.
Figure 7B:
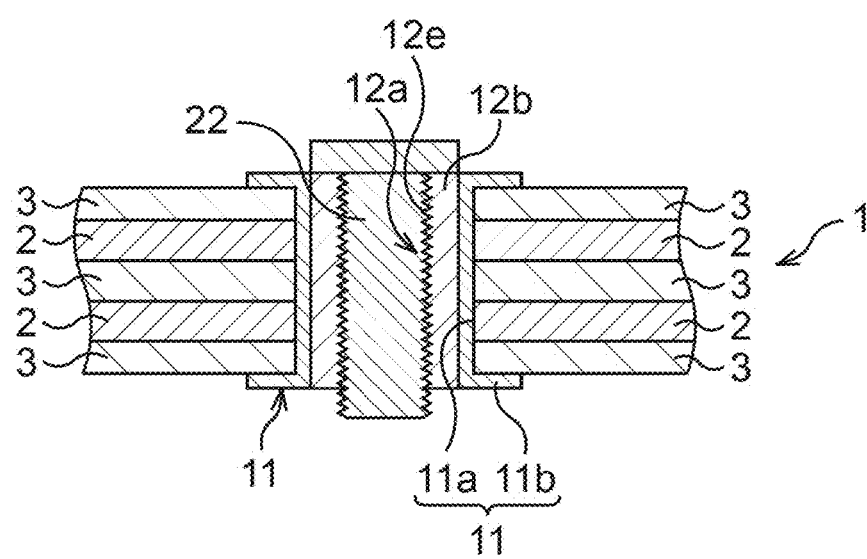

FIGS. 7A and 7B are schematic sectional views illustrating main steps of a method of manufacturing the thick copper substrate according to this embodiment. Note that the same components as those of the thick copper substrate according to the first embodiment are denoted by the same numerals, and detailed explanation thereof will be omitted.

In this embodiment, first of all, the steps in FIG. 1A to FIG. 2B are performed as in the first embodiment. A second conductive layer 12b including a second through hole 12a is formed in a base 1 to cover an inner wall side surface of a first conductive layer 11b of the PTH 11.

Subsequently, as illustrated in FIG. 7A, a thread groove 12e is formed on an inner wall side surface of the second through hole 12a. Thus, the thick copper substrate according to this embodiment is formed.

In detail, the thread groove 12e being a female thread is formed on the inner wall side surface (side surface of the second conductive layer 12b) of the second through hole 12a by shaving the second through hole 12a. In this event, it is also possible to repair the thread groove by helical insert processing.

In this thick copper substrate, a screw 22 as a terminal is engaged and fixed to the inside of the second through hole 12a as illustrated in FIG. 7B.

In detail, the screw 22 is inserted into and fixed to the second through hole 12a having the inner wall side surface formed with the thread groove 12e. In this case, the screw 22 may be used also as a fixing member of the thick copper substrate with another not-illustrated printed-circuit board or the like to connect with the printed-circuit board or the like.

In this embodiment, the second conductive layer 12b in close contact with the side surface of the first conductive layer 11b in the PTH 11 is formed without the first conductive layer 11b being formed thick, thereby securing the conductive layer thickness on the inner wall side surface of the PTH 11. With this configuration, the second conductive layer 12b protects the first conductive layer 11b to suppress occurrence of cracks in the first conductive layer 11b. Since the first conductive layer 11b made by the plating method is formed thin, the first conductive layer 11b can be easily formed into a fine pattern without deteriorating the productivity of plating. Even if a part of the second conductive layer 12b is slightly damaged in forming the thread groove 12e, its influence is small because a sufficient conductive layer thickness by the first conductive layer 11b and the second conductive layer 12b is secured on the inner wall side surface of the PTH 11, so that the high connection reliability of the screw 22 is maintained.

In this embodiment, a conductive layer to which the screw 22 is engaged and fixed, here, the second conductive layer 12b has a Vickers hardness set to a value in a range of 30 Hv or more and 400 Hv or less. The conductive layer is required to have hardness to withstand the processing of forming the thread groove 12e. The lower limit value of the hardness is evaluated to be about 30 Hv in Vickers hardness. On the other hand, if the conductive layer is too hard, appropriate press fitting into the PTH 11 becomes difficult at the step in FIG. 1D. The upper limit value of the hardness is evaluated to be about 400 Hv in Vickers hardness. In this embodiment, Cu being a conductive material having a Vickers hardness of a value in a range of 30 Hv or more and 400 Hv or less is used as the material of the second conductive layer 12b. The second conductive layer 12b is surely brought into close contact with and fixed to the first conductive layer 11b to suppress occurrence of cracks in the first conductive layer 11b and realize a thick copper substrate securing the connection reliability even if the thread groove 12e is formed therein.

The second conductive layer 12b covering the side surface of the first conductive layer 11b is formed to increase the conductive layer thickness on the inner wall side surface of the PTH 11, thereby increasing also the amount of current allowed to flow through one PTH 11. This makes it possible to reduce the number of PTHs 11 required for desired current to flow, thereby improving the degree of freedom in substrate design.

Since only the conductive layer on the inner wall side surface of the PTH 11 of the second conductive layer 12b is formed thick without the first conductive layer 11b being formed thick, the first conductive layer 11b can be easily formed into a fine pattern without deteriorating the productivity of plating.

As described above, according to this embodiment, the conductive layer (second conductive layer 12b) with a desired thickness is accurately secured on the inner wall side surface of the PTH 11 without using solder (having a Vickers hardness of 20 Hv or less). This makes it possible to form the thread groove 12e in the second through hole 12a with high reliability and insert and fix the screw 22 thereto, and realize direct screw fixation to the printed-circuit board or the like with the terminal that is impossible in the prior art, leading to expectation in expansion to various use scenes.

Note that one kind of conductive material selected from Al, Ni, Fe, a Cu alloy, an Al alloy, a Ni alloy, a Fe alloy and the like in place of and different from Cu may be employed as the second conductive layer formed in the PTH 11 also in the second embodiment, as in the modified example 2 of the first embodiment.

In the modified example 2 of the first embodiment and the second embodiment, a non-through hole not penetrating the Cu coin 12 (Al alloy coin 21) may be formed as a second hole in the Cu coin 12 (Al alloy coin 21) as in the modified example 1 of the first embodiment.

The second through hole 12a (21a) or the non-through hole 12c is formed in a circular shape corresponding to the press-fit pin 13 (screw 22) in the first and second embodiments and modified examples, but the first through hole 11a may be formed in a shape different from that of the second through hole 12a (21a) or the non-through hole 12c. Conceivable examples of the shape include a rectangular shape, an elliptical shape and so on. In the case of the rectangular shape, the shape is desirably made to have corners rounded in order to prevent breakage or the like in press-fitting the coin made of conductive material into the PTH.

Figure 8:
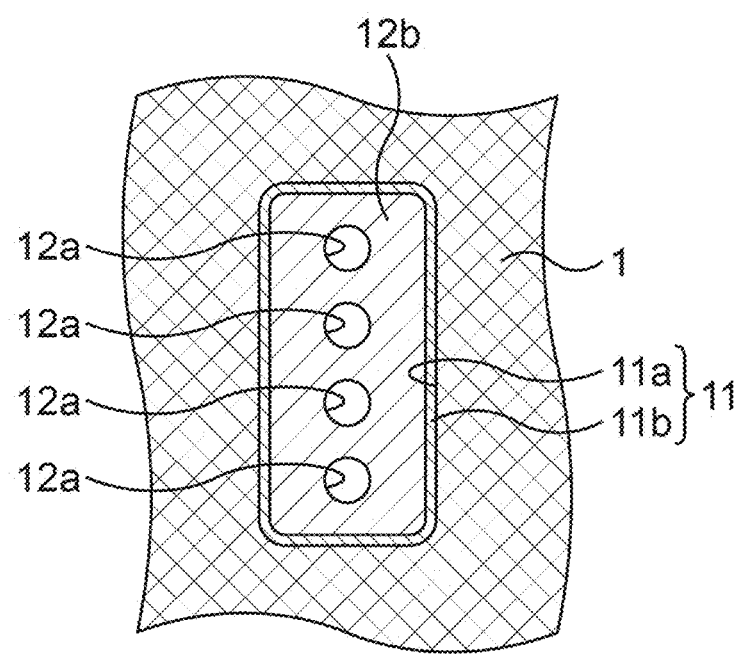
FIG. 8 is a schematic plan view illustrating another example of the thick copper substrate.

One example is illustrated in FIG. 8. The case of the first embodiment is exemplified here. Press-fit pins 13 inserted into a plurality of adjacent second through holes 12a formed in the same second conductive layer 12b are set at the same potential.

In the case of FIG. 8, the first through hole 11a is formed, for example, into a rectangular shape with rounded corners, the first conductive layer 11b is formed by plating, and then the Cu coin 12 is inserted into the PTH 11. The Cu coin 12 is a columnar Cu material and has a length slightly larger than the thickness of the base 1, a cross-sectional shape being the same rectangular shape as that of the first through hole 11a, and a size slightly smaller than the size of the PTH 11. Pressure is applied to the Cu coin 12 from above and below to pressure-bond the Cu coin 12 to the first conductive layer 11b. Then, a plurality of (four, here) second through holes 12a are formed in the Cu coin 12.

Third Embodiment

In this embodiment, an inverter is disclosed to which the thick copper substrate according to the first embodiment or its modified example is applied.

Figure 9A:
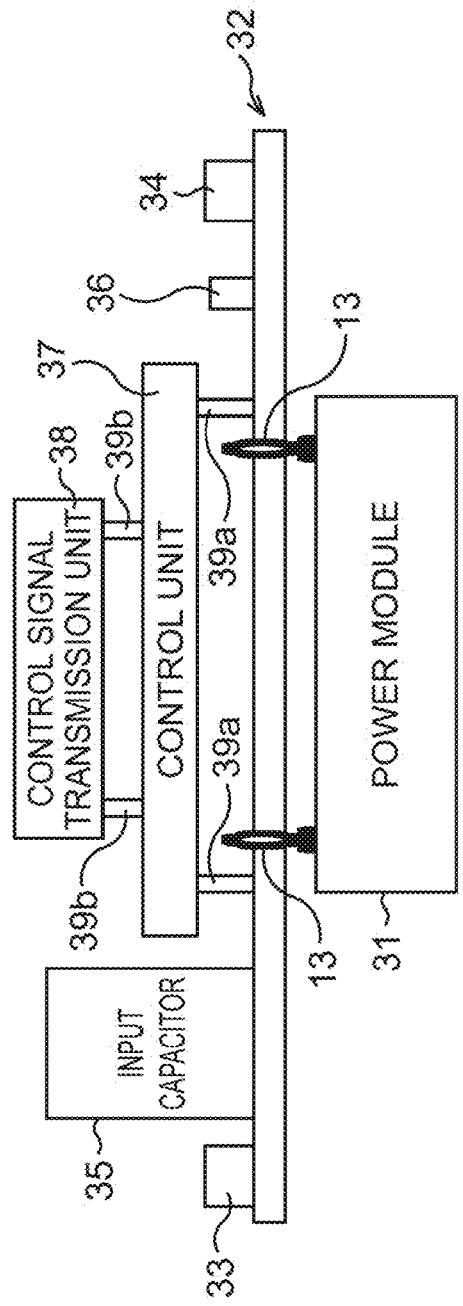

FIGS. 9A and 9B are schematic views illustrating a schematic configuration of the inverter according to this embodiment, FIG. 9A is a sectional view and FIG. 9B is a plan view.

This inverter includes a power module 31, a thick copper substrate 32 on which various components are mounted.

The power module 31 is a power semiconductor element made by combining a plurality of functional elements such as a transistor, a diode, a thyristor and so on.

The thick copper substrate 32 is a thick copper substrate according to the first embodiment or its modified example. FIGS. 9A and 9B illustrate, for example, the thick copper substrate according to the first embodiment. On the surface of the thick copper substrate 32, an input terminal 33, an output terminal 34, an input capacitor 35, a three-layer reactor 36, a control unit 37 of the power module 31, and a control signal transmission unit 38 are mounted. The control unit 37 is electrically connected to the top of the thick copper substrate 32 via connectors 39a, and the control signal transmission unit 38 is electrically connected to the top of the control unit 37 via connectors 39b.

The thick copper substrate 32 is formed with a plurality of PTHs, and the press-fit pins 13 are inserted into and fixed to the PTHs respectively. These press-fit pins 13 electrically connect the power module 31 with the thick copper substrate 32.

According to this embodiment, a highly reliable inverter including the thick copper substrate 32 in which a conductive layer having a desired thickness is secured with high accuracy on the inner wall side surface of the through hole without using solder and the terminal can be inserted and fixed with high reliability without damaging the conductive layer, is realized.

In one aspect, a substrate in which a conductive layer having a desired thickness is secured with high accuracy on an inner wall side surface of a through hole without using solder and a terminal can be inserted into and fixed to the through hole with high connection reliability, is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A substrate comprising:
a base including a first hole penetrating the base;
a first conductive layer covering an inner wall side surface of the first hole; and
a second conductive layer covering a side surface of the first conductive layer and including a second hole,
wherein the second conductive layer is different in crystalline structure from the first conductive layer and has a Vickers hardness of a value of 30 Hv or more.

2. The substrate according to claim 1, wherein the second conductive layer is in close contact with the first conductive layer.

3. The substrate according to claim 1, wherein the second conductive layer is made of a same conductive material as a conductive material of the first conductive layer and has a crystal grain larger than a crystal grain of the first conductive layer.

4. The substrate according to claim 1, wherein the second conductive layer is made of a conductive material different from a conductive material of the first conductive layer.

5. The substrate according to claim 1, wherein the second conductive layer has a Vickers hardness of a value of 400 Hv or less.

6. The substrate according to claim 1, wherein:
the second hole is in a circular shape; and
the first hole is in a shape different from the shape of the second hole.

7. The substrate according to claim 6, wherein the second conductive layer includes a plurality of the second holes.

8. The substrate according to claim 1, further comprising:
a terminal inserted into and fixed to the second hole.

9. The substrate according to claim 8, wherein the terminal is a press-fit pin or a screw.

10. The substrate according to claim 8, wherein the second conductive layer has a thread groove formed on a side surface in the second hole.

11. A method of manufacturing a substrate, the method comprising:
forming a first hole, the first hole penetrating a base;
forming a conductive layer, the conductive layer covering an inner wall side surface of the first hole;
inserting a columnar electric conductor into the first hole formed with the conductive layer;
applying pressure in a vertical direction to the columnar electric conductor; and
forming a second hole in the columnar electric conductor.

12. The method of manufacturing a substrate according to claim 11, wherein the columnar electric conductor is made of a same conductive material as a conductive material of the conductive layer or a conductive material different from the conductive material of the conductive layer.

13. The method of manufacturing a substrate according to claim 11, wherein the columnar electric conductor has a side surface brought into close contact with the conductive layer.

14. The method of manufacturing a substrate according to claim 11, wherein the columnar electric conductor has a diameter smaller than a diameter of the first hole via the conductive layer, and has a length larger than a thickness of the base.

15. The method of manufacturing a substrate according to claim 11, wherein the columnar electric conductor has a Vickers hardness of a value of 30 Hv or more and a value of 400 Hv or less.

16. The method of manufacturing a substrate according to claim 11, wherein the second hole is a hole penetrating the columnar electric conductor.

17. The method of manufacturing a substrate according to claim 11, wherein the second hole is a hole not penetrating the columnar electric conductor.

18. The method of manufacturing a substrate according to claim 11, wherein:
   the second hole is in a circular shape; and
   the first hole is in a shape different from the shape of the second hole.

19. The method of manufacturing a substrate according to claim 18, wherein the columnar electric conductor includes a plurality of the second holes.

20. The method of manufacturing a substrate according to claim 11, further comprising:
   forming a thread groove on an inner wall side surface of the second hole.

* * * * *